United States Patent [19]
Uemura

[11] Patent Number: 5,495,125
[45] Date of Patent: Feb. 27, 1996

[54] MOLDED SEMICONDUCTOR DEVICE

[75] Inventor: Kazuyoshi Uemura, Tokyo, Japan

[73] Assignee: NEC Corporation, Tokyo, Japan

[21] Appl. No.: 343,971

[22] Filed: Nov. 18, 1994

[30] Foreign Application Priority Data

Nov. 19, 1993 [JP] Japan .................... 5-290338

[51] Int. Cl.$^6$ .................... H01L 23/495; H01L 39/00; H01L 29/40
[52] U.S. Cl. .................... 257/666; 257/664; 257/662
[58] Field of Search .................... 257/666, 664, 257/666.4, 662, 666.3

[56] References Cited

U.S. PATENT DOCUMENTS

| | | | |
|---|---|---|---|
| 4,766,478 | 8/1988 | Dennis | 257/666 |
| 4,987,473 | 1/1991 | Johnson | 257/666 |
| 5,057,805 | 10/1991 | Kadowaki | 257/666 |
| 5,359,224 | 10/1994 | Heinen et al. | 257/666 |

FOREIGN PATENT DOCUMENTS

| | | | |
|---|---|---|---|
| 59-103364 | 6/1984 | Japan | 257/666.3 |
| 62-239560 | 10/1987 | Japan | 257/666.4 |
| 1209752 | 8/1989 | Japan | 257/666.3 |
| 2302051 | 12/1990 | Japan | 257/666.3 |
| 4017360 | 1/1992 | Japan | 257/666.3 |
| 4144161 | 5/1992 | Japan | 257/666.4 |
| 6-85155 | 3/1994 | Japan | |

Primary Examiner—Sara W. Crane
Assistant Examiner—Jhihan Clark
Attorney, Agent, or Firm—Popham, Haik, Schnobrich & Kaufman, Ltd.

[57] ABSTRACT

It is an object of the present invention to provide a molded semiconductor device which allows its package to be mounted on an external circuit even if the width of the conductor of a high-frequency signal transmission line on a packaging substrate of an external circuit is large, when the molded semiconductor device is to be connected to the external circuit. A semiconductor chip 3 is mounted on a first metal member 2 by mounting solder of AuSn or the like by bonding. The semiconductor chip 3 has a high-frequency signal terminal connected to a second metal member 1 by a metal wire 4 of Au or the like by bonding. The second metal member 1 is branched in a mold area 6 into two central conductors 1a, 1b which extend out of the mold area 6. The first metal member 2 has two ground conductors 2a, 2b which are disposed one on each side of the central conductors 1a, 1b. If an existing semiconductor package has a lead pitch P and a lead width M, then the distance $L_2$ between the ground conductors 2a, 2b may be determined by (3×P−M), and is typically 1.73 mm. Since the distance $L_2$ is greater than the width B (1.3 mm) of a conductor 10 on a packaging substrate of an external circuit, the central conductors 1a, 1b can be mounted on the conductor 10 on the packaging substrate.

2 Claims, 5 Drawing Sheets

A DIMENSIONAL MATCHING

MOLDED SEMICONDUCTOR DEVICE

BACKGROUND OF THE INVENTION

1. Field of the Invention

The present invention relates to a molded semiconductor device, and more particularly to a molded semiconductor device for use in a high-frequency band.

2. Description of the Related Art

Known molded semiconductor devices inventions are disclosed, for example, in U.S. Pat. No. 5,057,805 and Japanese Patent Laid-open No. 85155/94 (the inventor Kazuyoshi Uemura). According to the disclosed inventions, metal members connected to a semiconductor chip by metal wires or the like by a bonding process allow electric connection between an external circuit extending from inside the resin mold to the outside and the semiconductor chip in the resin mold.

FIGS. 1(a) and 1(b) of the accompanying drawings show, in plan and fragmentary cross section of a high-frequency signal transmission line at enlarged scale, respectively, the conventional molded semiconductor device disclosed in U.S. Pat. No. 5,057,805.

As shown in FIG. 1(a), a semiconductor chip 3 mounted on a first metal member 2 as a ground conductor, and second metal members 1 as a central conductor serve as terminals for connection to an external circuit. The first metal member 2 has portions disposed in sandwiching relation to the second metal members 1. The second metal members 1 and the first metal member 2 jointly constitute transmission lines or input/output terminals 8 for high-frequency signals. Metal wires 4 connect the semiconductor chip 3 and the second metal members 1 to each other by bonding, thus connecting the semiconductor chip 3 to the external circuit. Metal wires 5 connect the semiconductor chip 3 and the first metal member 2 to each other by bonding, thus connecting the semiconductor chip 3 to ground. A mold area 6 is sealed up by a molded resin body 7. The molded resin body 7 serves to protect the semiconductor chip 3 and the metal wires 4, 5 and also to position the first metal member 2 and the second metal members 1 securely relatively to each other.

As shown in FIG. 1(b), each of the transmission lines 8 is formed by the second metal member 1 sandwiched between and spaced from two portions of the first metal members 2 by a distance G within the molded resin body 7 which has a relative dielectric constant $\epsilon_r$. The characteristic impedance Z of the transmission lines 8 can be designed as follows: First, the electrostatic capacitance C between the second metal member 1 and the two portions of the first metal member 2 which are disposed one on each side of the second metal member 1 is determined according to a mathematical process such as a conformal mapping process or the like. The characteristic impedance Z may be determined according to the following formula (1):

$$z = (\epsilon \cdot \mu)^{1/2}/C. \qquad (1)$$

where $\epsilon$ is the dielectric constant of the medium, and $\mu$ is the magnetic permeability of the medium.

Transmission lines for high-frequency signals in communication devices and transmission devices which employ semiconductor devices of the type described above are designed primarily with a characteristic impedance of 50 Ω or 75 Ω. For example, if the molded resin body 7 has a sufficient resin thickness and the relative dielectric constant $\epsilon_r$ is almost 5, then the characteristic impedance Z of the transmission lines 8 may be realized almost 50 Ω when a lead frame is designed with the thickness "d" of the first metal member 2 and the second metal members 1 being almost 0.2 mm, the distance G between the first metal member 2 and the second metal members 1 being almost 0.45 mm, and the width W of the second metal members 1 being almost 0.4 mm.

In the manufacture of the semiconductor device of the type described above, the cost of facility investments may be minimized by employing a production line for existing semiconductor packages having standardized external forms.

FIGS. 2(a), 2(b), and 2(c) show, in plan, front elevation, and side elevation, respectively, an example of an existing semiconductor package which is standardized. The appearance of the semiconductor package shown in FIGS. 2(a) through 2(c) is a 225-mil. 20-pin SSOP (Shrink Small Outline Package) with a lead pitch P of 0.65 mm and a lead width W of 0.22 mm.

FIG. 3 fragmentarily shows in plan a high-frequency signal transmission line at enlarged scale where the arrangement disclosed in U.S. Pat. No. 5,057,805 is incorporated in the 20-pin SSOP shown in FIGS. 2(a) through 2(c). FIG. 3 also illustrates a conductor of a high-frequency signal transmission line on a packaging substrate in an external circuit. In FIG. 3, references P, M correspond respectively to the lead pitch P and the lead width M shown in FIG. 2(b). A second metal member 1 as a central conductor and first metal members 2 sandwiching the second metal member 1 and serving as two ground conductors jointly make up a high-frequency signal transmission line. The two first metal members 2 sandwiching the second metal member 1 are spaced from each other by a distance $L_2$. The distance $L_2$, which may be determined according to (2×P−M), is 1.08 mm. The distance $L_1$ between the centers of the first metal members 2 is 2×P=1.30 mm.

Users of the semiconductor device of the type described above use packaging substrates of glass epoxy or Teflon or the like. The packaging substrate has a thickness in the range of from 0.4 mm to 0.8 mm in view of warpage or the like thereof after circuits are patterned thereon. In addition, the high-frequency signal transmission line on the packaging substrate is mainly composed of a microstrip line in order to minimize an area occupied thereby when it is designed.

For example, if a high-frequency signal transmission line of 50 Ω is produced with a Teflon packaging substrate having a thickness of 0.4 mm, then the conductor 10 of a microstrip line thereof has a width B of almost 1.3 mm. If the 20-pin SSOP which incorporates the arrangement disclosed in U.S. Pat. No. 5,057,805 were mounted on such a packaging substrate, then the distance $L_2$ (1.08 mm) between the two first metal members 2 sandwiching the second metal member 1 on the package side would be smaller than the width B (1.3 mm) of the conductor 10 which forms the microstrip line on the packaging substrate, resulting in a dimensional mismatch. Therefore, the first metal members 2 of the package would be brought into contact with the conductor 10 on a packaging substrate, causing a short circuit, so that the package could not be mounted on the conductor 10.

SUMMARY OF THE INVENTION

In view of these facts, an object of the present invention is to provide a molded semiconductor device which allows its package to be mounted on an external circuit even if the width of the conductor of a high-frequency signal transmission line on a packaging substrate of an external circuit is large, when the molded semiconductor device is to be connected to the external circuit.

To achieve the above object, a molded semiconductor device of the present invention includes: a molded resin body; a semiconductor chip sealed up by the molded resin body; first metal members sealed up by the molded resin body and serving as a ground conductor on which the semiconductor chip is mounted; and a second metal member sealed up by the molded resin body and serving as a central conductor which is connected to the semiconductor chip by wire bonding for electrically connecting the semiconductor chip to an external circuit, the second metal member being sandwiched between two portions of the first metal members, the first metal members and the second metal member jointly making up a high-frequency input/output terminal as a high-frequency transmission line having a predetermined impedance, the second metal member extending out of a mold area of the molded resin body and branched into a plurality of metal members, the first metal members being disposed one on each side of the plurality of metal members outside of the mold area.

The above-described molded semiconductor device of the present invention may be mounted on an existing lead frame.

Since with the above arrangement, the present invention constructs high-frequency transmission lines having a constitution that the first metal members are 10 disposed one on each side of the plurality of metal members branched from the second metal member which extending outwardly from the mold area, the distance between the two first metal members may be increased in a manner to match the width of a conductor of a high-frequency transmission line (microstrip line) on a packaging substrate of an external circuit. Therefore, when the molded semiconductor device is to be connected to the external circuit, the molded semiconductor package can be mounted on the external circuit even if the width of the conductor of the high-frequency signal transmission line on the packaging substrate of the external circuit is large.

Further, the principles of the present invention are effective in increasing the freedom in designing high-frequency signal handling configurations on existing molded semiconductor packages. Accordingly, it becomes possible to reduce unwanted design investments, and realize an inexpensive semiconductor device production line which can sufficiently utilize existing production line facilities.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENT

The two embodiments of the molded semiconductor device of the present invention will be explained with reference to the accompanying drawings.

Figure 4:
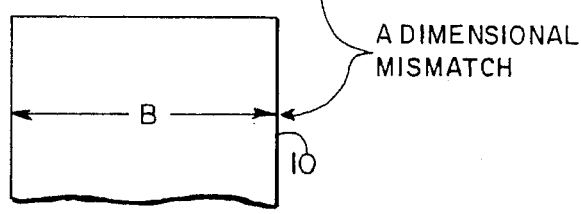
FIG. 4 is a schematic plan view of a molded semiconductor device according to a first embodiment of the present invention.
Figure 4:
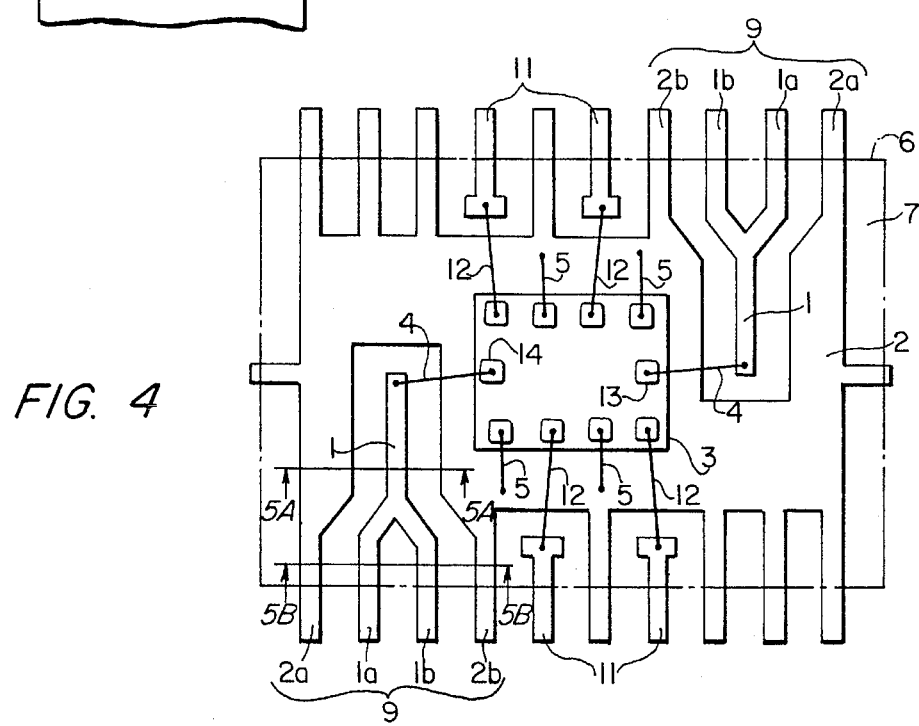

FIG. 4 is a schematic plan view of a molded semiconductor device according to a first embodiment of the 10 present invention. As shown in FIG. 4, a semiconductor chip 3 is mounted on a first metal member (hereinafter referred to as a "ground conductor") 2 by mounting solder of AuSn or the like, and second metal members (hereinafter referred to as "central conductors") 1 each extending outwardly from a mold area 6 and branched into two central conductors 1a, 1b. The two central conductors 1a, 1b are sandwiched between two ground conductors 2a, 2b. The central conductors 1a, 1b and the ground conductors 2a, 2b jointly constitute a high-frequency signal transmission line 9.

The semiconductor chip 3 has high-frequency signal terminals including a high-frequency signal input pad 13 and a high-frequency signal output pad 14. These high-frequency signal input and output pads 13, 14 are connected to the central conductors 1 by metal wires 4 such as Au wires by bonding. The semiconductor chip 3 is connected to the ground conductor 2 by metal wires 5 by bonding. Central conductors 11 are used as DC signal terminals such as power supply terminals. The semiconductor chip 3 is connected to the central conductors 11 by metal wires 12 by bonding. The mold area 6 is sealed up by a molded resin body 7. The molded resin body 7 serves to protect the semiconductor chip 3 and the metal wires 4, 5, 12 and also to position the central conductors 1, 1a, 1b, 11 and the ground conductors 2, 2a, 2b securely relatively to each other.

Figure 1A:
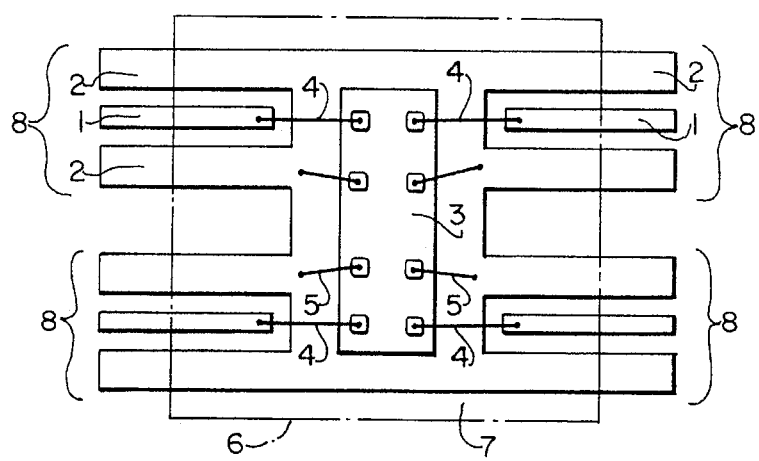
FIG. 1(a) is a plan view of a conventional molded semiconductor device.
Figure 1B:
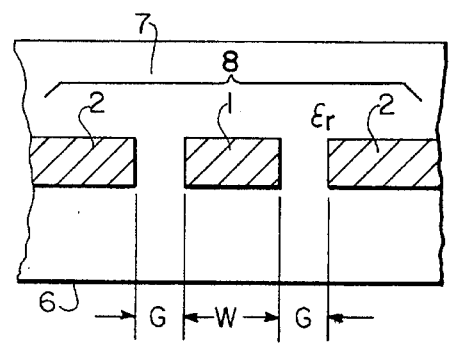
FIG. 1(b) is an enlarged fragmentary cross-sectional view of a high-frequency signal transmission line of the conventional molded semiconductor device shown in FIG. 1(a)
Figure 2A:
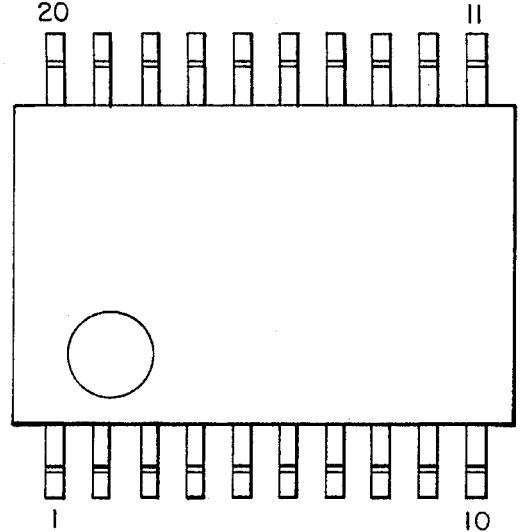
FIGS. 2(a), 2(b), and 2(c) are plan, front elevational, and side elevational views, respectively, of an example of an existing semiconductor package which is standardized.
Figure 2B:
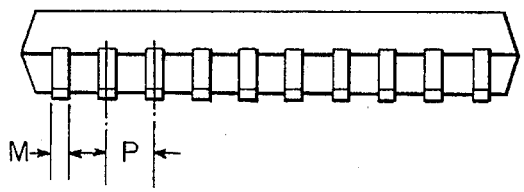
Figure 2C:
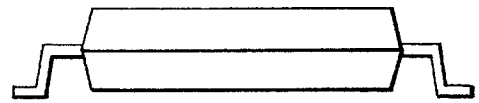
Figure 3:
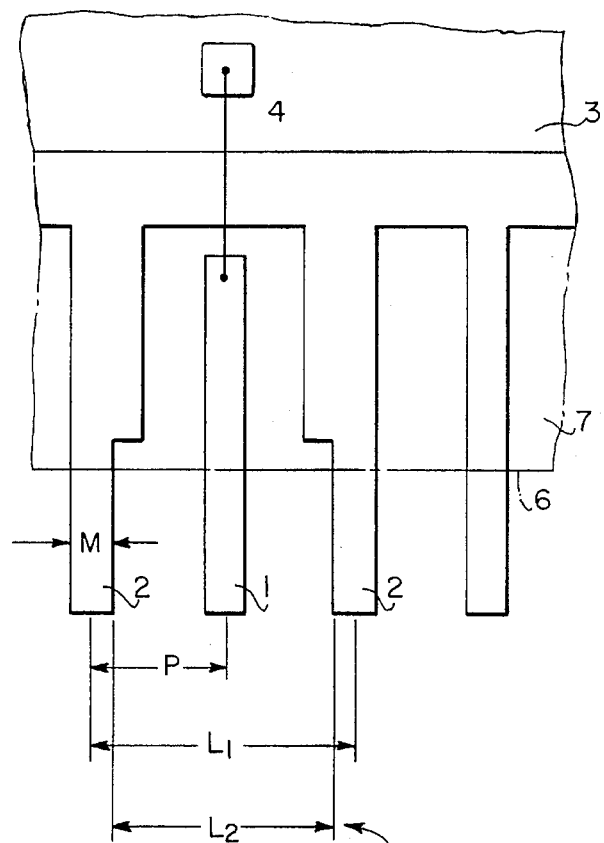
FIG. 3 is an enlarged fragmentary plan view of a high-frequency signal transmission line where the arrangement shown in FIGS. 1(a) and 1(b) is incorporated in the semiconductor package shown in FIGS. 2(a) through 2(c), the view also showing a conductor of a high-frequency signal transmission line on a packaging substrate in an external circuit.
Figure 5A:
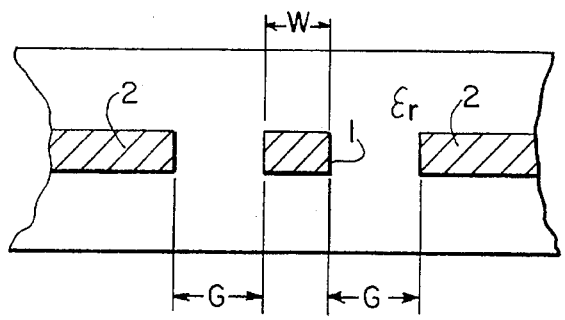
FIG. 5(a) is an enlarged fragmentary cross-sectional view taken along line 5A—5A of FIG. 4, showing a high-frequency signal transmission line.
Figure 9A:
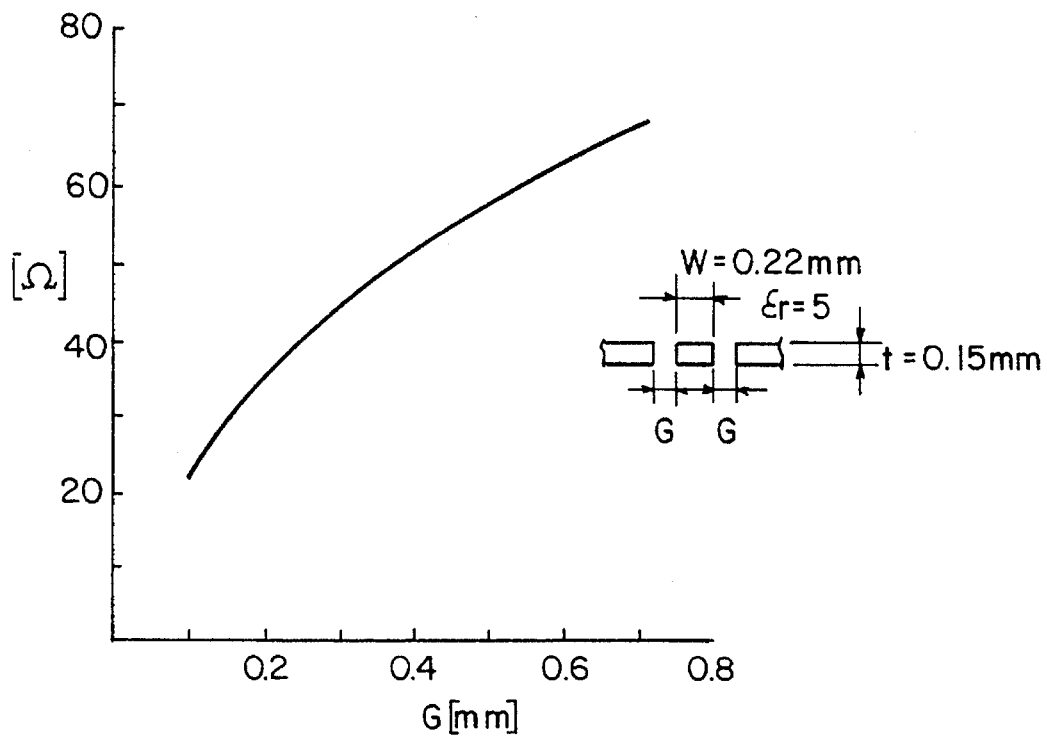
FIGS. 9(a) and 9(b) are diagrams showing design charts used for designing a high-frequency signal transmission line according to the present invention.

FIG. 5(a), which is taken along line 5A—5A of FIG. 4, fragmentarily shows the high-frequency signal transmission line 9 at enlarged scale. In the high-frequency signal transmission line 9, as shown in FIG. 5(a), the central conductor 1 is sandwiched between and spaced from the two ground conductors 2 by a distance G within the molded resin body 7 which has a relative dielectric constant $\epsilon_r$. As with the structure shown in FIG. 1(b), the transmission line is composed of the second metal member as the central conductor 1 and the two first metal members as the ground conductors 2 disposed one on each side of the central conductor 1. The characteristic impedance of the transmission line 9 can be designed according to a design chart shown in FIG. 9(a) insofar as each of the metal members, i.e., the central conductor 1 and the ground conductors 2, has a thickness "t" of 0.15 mm, the central conductor 1 has a width W (corresponding to the lead width M shown in FIG. 2(b)) of 0.22 mm, and the relative dielectric constant $\epsilon_r$ of the molded resin body 7 is almost 5. For example, if the distance G between the central conductor 1 and the two ground conductors 2 may be set to almost 0.4 mm from the design chart shown in FIG. 9(a), then the transmission line 9 is to be designed for a characteristic impedance of 50 Ω.

Figure 5B:
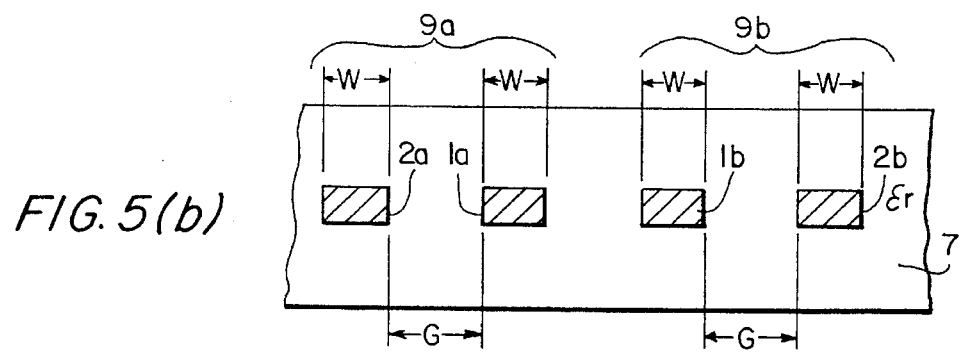
FIG. 5(b) is an enlarged fragmentary cross-sectional view taken along line 5B—5B of FIG. 4, showing the high-frequency signal transmission line.
Figure 9B:
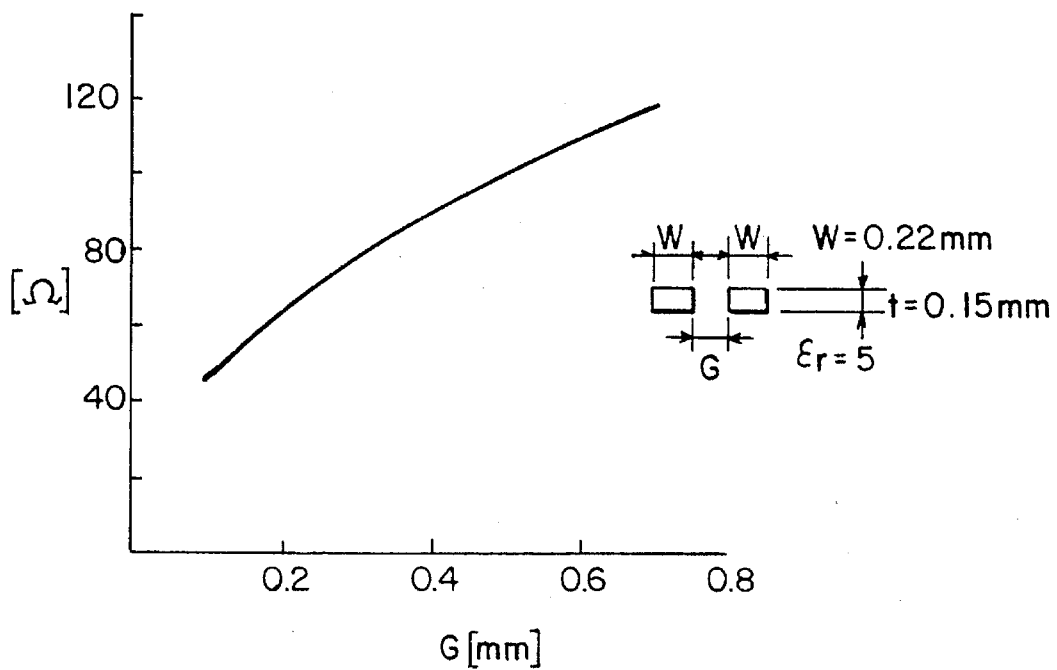

FIG. 5(b), which is taken along line 5B—5B of FIG. 4, also fragmentarily shows the high-frequency signal transmission line 9 at enlarged scale. As shown in FIG. 5(b), the central conductors 1a, 1b and the ground conductors 2a, 2b have a width W (corresponding to the lead width M shown in FIG. 2(b)) each, and are spaced by the distance G within the molded resin body 7 which has a relative dielectric constant $\epsilon_r$. The structure shown in FIG. 5(b) is considered a high-frequency signal transmission line 9a composed of the central conductor 1a and the ground conductor 2a and a high-frequency signal transmission line 9b composed of the central conductor 1b and the ground conductor 2b, the high-frequency signal transmission lines 9a, 9b lying parallel to each other. The characteristic impedance of each of the transmission lines 9a, 9b can be designed according to a design chart shown in FIG. 9(b) insofar as each of the central conductor 1 and the ground conductors 2, has a width W (corresponding to the lead width M shown in FIG. 2(b)) of 0.22 mm and a thickness "t" of 0.15 mm, and the relative dielectric constant $\epsilon_r$ of the molded resin body 7 is almost 5. Therefore, the characteristic impedance of the transmission line 9 is considered to be the characteristic impedance of the transmission lines 9a, 9b connected parallel to each other. For example, if the characteristic impedance of each of the transmission lines 9a, 9b may be set to almost 100 Ω, then the transmission line 9 is to be designed for a characteristic impedance of 50 Ω.

In the first embodiment, the distance G is 0.43 mm. Therefore, the characteristic impedance Z of each of the transmission lines 9a, 9b is almost 95 Ω. The entire characteristic impedance of the transmission line 9 is therefore 47.5 Ω≈50 Ω.

Figure 6:
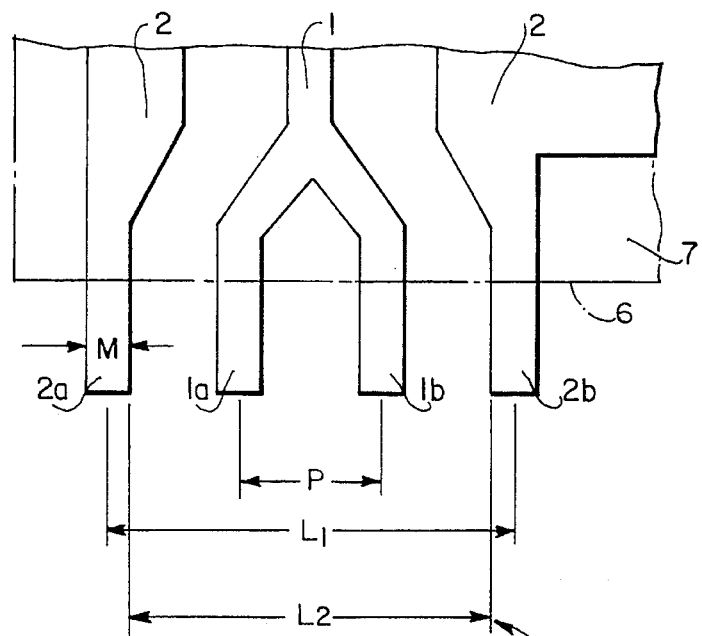
FIG. 6 is an enlarged fragmentary plan view of the high-frequency signal transmission line of the molded semiconductor device shown in FIG. 4, the view also showing a conductor of a high-frequency signal transmission line on a packaging substrate in an external circuit.
Figure 6:
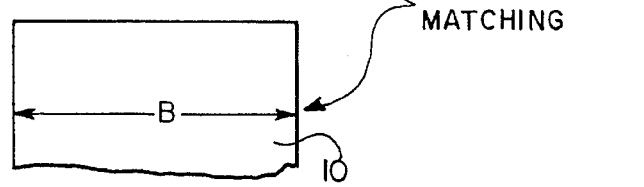

FIG. 6 fragmentarily shows the high-frequency signal transmission line 9 shown in FIG. 4 at enlarged scale. FIG. 6 also illustrates dimensions incorporated in the present invention in the above-described 20-pin SSOP configuration, the central conductors 1a, 1b of the high-frequency signal transmission lines and the ground conductors 2a, 2b, and a conductor 10 of a microstrip line on a packaging substrate of an external circuit, which conductor 10 is to be connected to the central conductor 1. In FIG. 6, references P, M correspond respectively to the lead pitch P and the lead width M shown in FIG. 2(b). The distance $L_2$ between the ground conductors 2a, 2b may be determined according to (3×P−M) and is 1.73 mm. The distance $L_2$ is greater than the width B (1.3 mm) of the conductor 10. Therefore, the central conductor 1 can be mounted on a transmission line (microstrip line) of 50 Ω which is composed of a Teflon member having a thickness of 0.4 mm. In inventions of the prior art, the central conductor 1 cannot be mounted on such a transmission line due to design dimensional limitations.

Figure 7A:
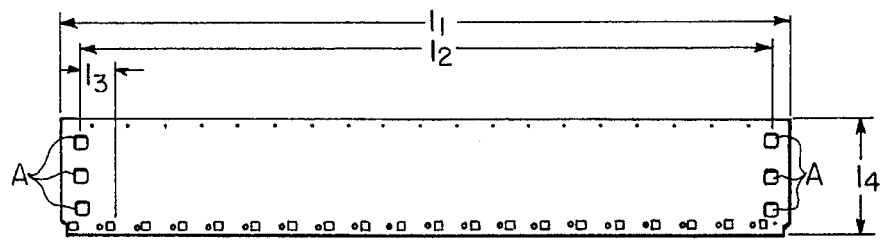
FIG. 7(a) is a schematic plan view of a lead frame for producing the molded semiconductor device shown in FIG. 4.
Figure 7B:
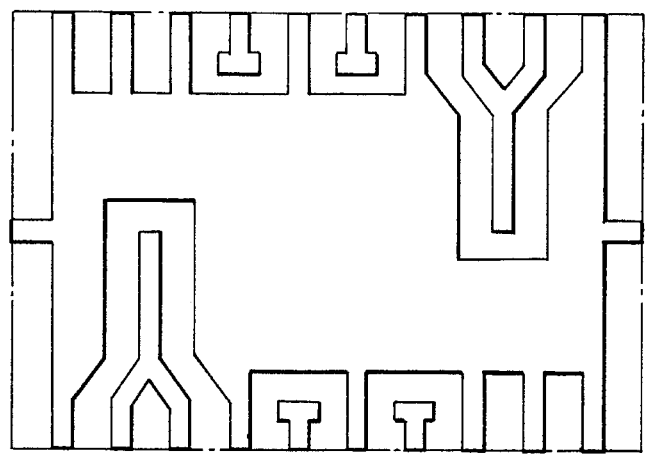
FIG. 7(b) is an enlarged fragmentary plan view showing a detailed pattern in a region A in FIG. 7(a)

FIG. 7(a) schematically shows a lead frame for producing the molded semiconductor device shown in FIG. 4, and FIG. 7(b) shows a detailed pattern in a region A in FIG. 7(a) at enlarged scale.

The lead frame shown in FIG. 7(a) is produced by etching or pressing a sheet of Cu or the like having a thickness of almost 0.15 mm to a desired pattern, and then plating the pattern with Ag or the like. A semiconductor chip manufactured in this manner such as GaAs IC or the like is then mounted on the lead frame by a paste of AuSn or Ag or the like. Thereafter, the semiconductor chip and the lead frame are connected by Au wires or the like by bonding, after which the mold area 6 shown in FIG. 4 is sealed up by the molded resin body 7 of epoxy or the like using a metallic mold assembly. Then, the entire assembly is plated with a solder layer, and the leads are cut and shaped, thus completing the molded semiconductor device according to the first embodiment. Specifically, when a semiconductor chip is mounted on the detailed pattern in the region A shown in FIG. 7(b), and then connected to the lead frame by wire bonding, the molded semiconductor device shown in FIG. 4 is fabricated.

In FIG. 7(a), dimensions 11, 12, 13, 14 are given as $l_1$=229.7±0.08 mm, $l_2$=19×11.5±0.03 mm=218.5 ±0.08 mm, $l_3$=11.5±0.03 mm, and $l_4$=34.950±0.05 min.

Figure 8:
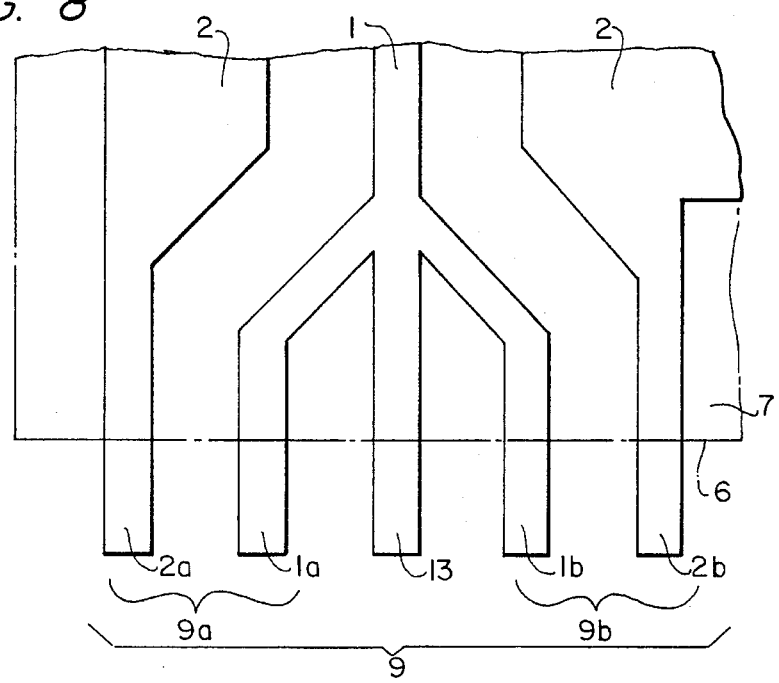
FIG. 8 is an enlarged fragmentary plan view of a high-frequency signal transmission line of a molded semiconductor device according to a second embodiment of the present invention.

FIG. 8 fragmentarily shows a high-frequency signal transmission line of a molded semiconductor device according to a second embodiment of the present invention at enlarged scale. The high-frequency signal transmission line, denoted at 9, comprises a central conductor 1 branched into three central conductors 1a, 13, 1b within a molded resin body 7, and two ground conductors 2a, 2b positioned one on each side of these three central conductors 1a, 13, 1b. In this constitution, the central conductor 1a and the ground conductor 2a jointly constitute a transmission line 9a, and the central conductor 1b and the ground conductor 2b jointly constitute a transmission line 9b. As no ground conductor corresponding to the central conductor 13 exists close to it, the central conductor 13 has a very high impedance compared with the transmission lines 9a, 9b. Therefore, a high-frequency signal is transmitted to the transmission lines 9a, 9b, but substantially not to the central conductor 13. The characteristic impedance of the transmission line 9 which is composed of the three central conductors 1a, 13, 1b and the two ground conductors 2a, 2b is determined by the characteristic impedance of the parallel-connected transmission lines 9a, 9b, and is substantially not affected by the central conductor 13. If each of the transmission lines 9a, 9b is designed for a characteristic impedance of 100 Ω, then the transmission line 9 has a characteristic impedance of 50 Ω. Since the central conductor 1 is branched into three central conductors in the second embodiment, the distance between the ground conductors 2a, 2b may be greater than the distance between the ground conductors 2a, 2b in the first embodiment.

Further, the principles of the present invention are also applicable to a high-frequency signal transmission line having the central conductor 1 branched into four or more central conductors.

It is to be understood that although the characteristics and advantages of the present invention have been set forth in the foregoing description, the disclosure is illustrative only, and changes may be made in the shape, size, and arrangement of the parts within the scope of the appended claims.

What is claimed is:

1. A molded semiconductor device comprising:

a molded resin body having a mold area;

a semiconductor chip sealed within said molded resin body;

first metal member sealed within said molded resin body and serving as a ground conductor on which said semiconductor chip is mounted;

a second metal member sealed within said molded resin body and serving as a central conductor which is connected to said semiconductor chip by wire bonding for electrically connecting said semiconductor chip to an external unit;

said second metal member being sandwiched between two portions of said first metal member;

said first metal member and said second metal member sealed within said molded resin body jointly forming a high-frequency input/output terminal as a first high-frequency transmission line having a first predetermined impedance;

said second metal member being branched to form a plurality of metal members that extend outwardly from said mold area of said molded resin body so that the device can accommodate connectors of varying widths, said first metal member having portions extending outwardly from said mold area disposed one on each side of said plurality of metal members extending outwardly from said mold area;

said portions of said first metal member and said plurality of metal members extending outwardly from said mold area jointly forming a second transmission line having a second predetermined impedance.

2. A molded semiconductor device according to claim 1, wherein said semiconductor device is mounted on an existing lead frame.

* * * * *